United States Patent
Racey et al.

(10) Patent No.: US 9,836,375 B2
(45) Date of Patent: Dec. 5, 2017

(54) METHOD AND SYSTEM FOR AUTOMATED TEST OF MULTI-MEDIA USER DEVICES

(71) Applicant: Contec, LLC, Schnectady, NY (US)

(72) Inventors: Darby Racey, Voorheesville, NY (US); Vladzimir Valakh, Troy, NY (US); Vicente Miranda, Clifton Park, NY (US); Rafael Villanueva, Clifton Park, NY (US)

(73) Assignee: Contec, LLC, Schenectady, NY (US)

( * ) Notice: Subject to any disclaimer, the term of this patent is extended or adjusted under 35 U.S.C. 154(b) by 0 days.

(21) Appl. No.: 15/593,562

(22) Filed: May 12, 2017

(65) Prior Publication Data

US 2017/0249226 A1    Aug. 31, 2017

Related U.S. Application Data

(62) Division of application No. 12/566,041, filed on Sep. 24, 2009.

(51) Int. Cl.
| | |
|---|---|
| G06F 11/07 | (2006.01) |
| G06F 11/27 | (2006.01) |
| G06F 11/273 | (2006.01) |
| G01R 31/319 | (2006.01) |
| G06F 11/263 | (2006.01) |
| G06F 17/50 | (2006.01) |

(52) U.S. Cl.
CPC ............ *G06F 11/27* (2013.01); *G01R 31/319* (2013.01); *G06F 11/263* (2013.01); *G06F 11/273* (2013.01); *G06F 11/2733* (2013.01); *G06F 17/5054* (2013.01)

(58) Field of Classification Search
USPC ........................................................ 702/117
See application file for complete search history.

(56) References Cited

U.S. PATENT DOCUMENTS

| | | | |
|---|---|---|---|
| 5,983,022 A | 11/1999 | Watkins | |
| 6,057,882 A | 5/2000 | Van Den Branden Lambrecht | |
| 6,367,032 B1 | 4/2002 | Kasahara | |
| 6,385,739 B1* | 5/2002 | Barton | G06F 11/006 713/189 |
| 6,662,135 B1 | 12/2003 | Burns | |
| 6,728,767 B1 | 4/2004 | Day | |
| 7,020,573 B2 | 3/2006 | Wheeler | |

(Continued)

FOREIGN PATENT DOCUMENTS

| | | |
|---|---|---|
| CN | 202261360 | 5/2012 |
| EP | 0989563 | 3/2000 |

(Continued)

OTHER PUBLICATIONS

Tiwari, Rajeev; Non-Final Office Action for U.S. Appl. No. 15/099,384, filed Apr. 14, 2016, dated Feb. 22, 2017, 13 pgs.

(Continued)

*Primary Examiner* — Paul D Lee
(74) *Attorney, Agent, or Firm* — Taylor English Duma LLP

(57) ABSTRACT

A test system, for example for set top boxes or game consoles, includes logic to reformat media signals output by a device under test, logic to receive the reformatted media signals and to analyze them for errors, and a pluggable interface coupling the device under test to the logic to reformat the media signals.

20 Claims, 3 Drawing Sheets

(56) References Cited

U.S. PATENT DOCUMENTS

| | | | |
|---|---|---|---|
| 7,103,802 B2 | 9/2006 | Stephens | |
| 7,222,255 B1 | 5/2007 | Claessens | |
| 7,664,317 B1 | 2/2010 | Sowerby | |
| 7,770,066 B2 | 8/2010 | Kui-Yon | |
| 8,209,732 B2 | 6/2012 | Le | |
| 8,229,344 B1 | 7/2012 | Petersen | |
| 8,324,909 B2 | 12/2012 | Oakes | |
| 8,418,219 B1 | 4/2013 | Parsons | |
| 8,515,015 B2 | 8/2013 | Maffre | |
| 8,595,784 B2 | 11/2013 | Vanderhoff | |
| 8,689,071 B2 | 4/2014 | Valakh | |
| 8,806,400 B1 | 8/2014 | Bhawmik | |
| 8,978,081 B2 | 3/2015 | McClay | |
| 2001/0034847 A1 | 10/2001 | Gaul, Jr. | |
| 2002/0055834 A1 | 5/2002 | Andrade | |
| 2002/0070725 A1 | 6/2002 | Hilliges | |
| 2003/0005380 A1 | 1/2003 | Nguyen | |
| 2003/0036875 A1* | 2/2003 | Peck | G06F 9/44505 702/127 |
| 2003/0182601 A1* | 9/2003 | Richardson | G01R 31/31830 714/46 |
| 2004/0016708 A1 | 1/2004 | Rafferty | |
| 2005/0138193 A1 | 6/2005 | Encarnacion | |
| 2005/0193294 A1 | 9/2005 | Hildebrant | |
| 2005/0286466 A1 | 12/2005 | Tagg | |
| 2006/0015785 A1 | 1/2006 | Chun | |
| 2006/0279301 A1 | 12/2006 | Treibergs | |
| 2007/0097659 A1 | 5/2007 | Behrens | |
| 2007/0124114 A1 | 5/2007 | Shapiro | |
| 2007/0220380 A1 | 9/2007 | Ohanyan | |
| 2007/0230357 A1 | 10/2007 | Lin | |
| 2008/0031151 A1 | 2/2008 | Williams | |
| 2008/0315898 A1 | 12/2008 | Cannon | |
| 2009/0013372 A1 | 1/2009 | Oakes | |
| 2009/0089854 A1 | 4/2009 | Le | |
| 2009/0282455 A1 | 11/2009 | Bell et al. | |
| 2010/0138823 A1 | 6/2010 | Thornley | |
| 2011/0001833 A1 | 1/2011 | Grinkemeyer | |
| 2011/0006794 A1 | 1/2011 | Sellathamby | |
| 2011/0012632 A1 | 1/2011 | Merrow | |
| 2011/0035676 A1 | 2/2011 | Tischer | |
| 2011/0072306 A1 | 3/2011 | Racey | |
| 2011/0099424 A1 | 4/2011 | Rivera Trevino | |
| 2011/0276684 A1 | 11/2011 | Singh | |
| 2012/0140081 A1 | 1/2012 | Clements | |
| 2012/0163227 A1 | 6/2012 | Kannan | |
| 2012/0198442 A1 | 8/2012 | Kashyap | |
| 2012/0275784 A1 | 11/2012 | Soto | |
| 2012/0278826 A1 | 11/2012 | Jones | |
| 2013/0076217 A1 | 3/2013 | Thompson | |
| 2013/0104158 A1 | 4/2013 | Partee | |
| 2013/0160064 A1 | 6/2013 | Van Rozen | |
| 2013/0167123 A1 | 6/2013 | Dura | |
| 2014/0115580 A1 | 4/2014 | Kellerman | |
| 2014/0123200 A1 | 5/2014 | Park | |
| 2014/0156819 A1 | 6/2014 | Cavgalar | |
| 2014/0187173 A1 | 7/2014 | Partee | |
| 2014/0207404 A1 | 7/2014 | Fritzsche | |
| 2014/0256373 A1 | 9/2014 | Hernandez | |
| 2014/0282783 A1 | 9/2014 | Totten | |
| 2014/0370821 A1 | 12/2014 | Guterman | |
| 2015/0109941 A1 | 4/2015 | Zhang | |
| 2016/0234163 A1 | 8/2016 | Nistor | |
| 2017/0048519 A1 | 2/2017 | Friel | |
| 2017/0302916 A1 | 10/2017 | Tiwari | |
| 2017/0302917 A1 | 10/2017 | Tiwari | |

FOREIGN PATENT DOCUMENTS

| | | |
|---|---|---|
| WO | 0113604 | 2/2001 |
| WO | 2013169728 | 11/2013 |

OTHER PUBLICATIONS

COMPAQ Computer Corporation; Plug and Play Bios Specification, Version 1.0A, May 5, 1994, 56 pgs.

Metrobility Optical Systems; Specification for "twister" 2131 100Mbps Multimode-to-Singlemode Media Converter, Apr. 2002, 16 pgs.

Racey, Darby; Advisory Action for U.S. Appl. No. 12/566,041, filed Sep. 24, 2009, dated Nov. 30, 2012, 2 pgs.

Racey, Darby; Final Office Action for U.S. Appl. No. 12/566,041, filed Sep. 24, 2009, dated Nov. 21, 2014, 15 pgs.

Racey, Darby; Final Office Action for U.S. Appl. No. 12/566,041, filed Sep. 24, 2009, dated May 5, 2016, 16 pgs.

Racey, Darby; Final Office Action for U.S. Appl. No. 12/566,041, filed Sep. 24, 2009, dated Jul. 7, 2012, 7 pgs.

Racey, Darby; Non-final Office Action for U.S. Appl. No. 12/566,041, filed Sep. 24, 2009, dated Oct. 31, 2011, 8 pgs.

Racey, Darby; Non-final Office Action for U.S. Appl. No. 12/566,041, filed Sep. 24, 2009, dated Dec. 15, 2016, 13 pgs.

Racey, Darby; Non-final Office Action for U.S. Appl. No. 12/566,041, filed Sep. 24, 2009, dated Apr. 4, 2014, 12 pgs.

Racey, Darby; Non-final Office Action for U.S. Appl. No. 12/566,041, filed Sep. 24, 2009, dated Sep. 23, 2015, 17 pgs.

Racey, Darby; Non-final Office Action for U.S. Appl. No. 12/566,041, filed Sep. 24, 2009, dated Sep. 6, 2013, 9 pgs.

Racey, Darby; Restriction Requirement for U.S. Appl. No. 12/566,041, filed Sep. 24, 2009, dated Feb. 15, 2012, 5 pgs.

Kumar, Samant; International Search Report and Written Opinion for PCT/US16/53768, filed Sep. 26, 2016, dated Feb. 3, 2017, 17 pgs.

Valakh, Vladzimir; Office Action for Canadian Patent Application No. 2,739,188, filed May 5, 2011, dated Feb. 24, 2017, 2 pgs.

Kumar, Samant; International Search Report and Written Opinion for PCT/US2016/058507, filed Oct. 24, 2016, dated Jan. 3, 2017, 12 pgs.

Nordman, Bruce, "Testing Products with Network Connectivity," Jun. 21, 2011 [retrieved online at http://citeseerx.is1.psu.edu/viewdoc/download?doi=10.1.1.695.772&rep=rep1&type=pdf on Feb. 6, 2017], 20 pgs.

Racey, Darby; Notice of Allowance for U.S. Appl. No. 12/566,041, filed Sep. 24, 2009, dated Jun. 16, 2017, 21 pgs.

CED Magazine; Article entitled: "Cable Connects in Atlanta", located at <https://www.cedmagazine.com/article/2006/04/Cable-connects-atlanta>, Apr. 30, 2006, 21 pgs.

Electronic Design; Article entitled: "Testing of MPEG-2 Set-Top Boxes Must be Fast, Thorough", located at <http://www.electronicdesign.com/print/839>, published Nov. 18, 2001, 9 pgs.

Tiwari, Rajeev; Final Office Action for U.S. Appl. No. 15/099,384, filed Apr. 14, 2016, dated Oct. 3, 2017, 29 pgs.

Racey, Darby; Notice of Allowance and Fees Due for U.S. Appl. No. 12/566,041, filed Sep. 24, 2009, dated Mar. 18, 2017, 14 pgs.

Huh, Ina; Non-Final Office Action for U.S. Appl. No. 15/624,971, filed Jun. 16, 2017, dated Sep. 12, 2017, 28 pgs.

* cited by examiner

METHOD AND SYSTEM FOR AUTOMATED TEST OF MULTI-MEDIA USER DEVICES

CROSS-REFERENCE TO RELATED APPLICATION

This application is a division of U.S. patent application Ser. No. 12/566,041, filed Sep. 24, 2009, the disclosure of which is hereby incorporated herein by reference in its entirety.

FIELD

This application relates to automated test equipment.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
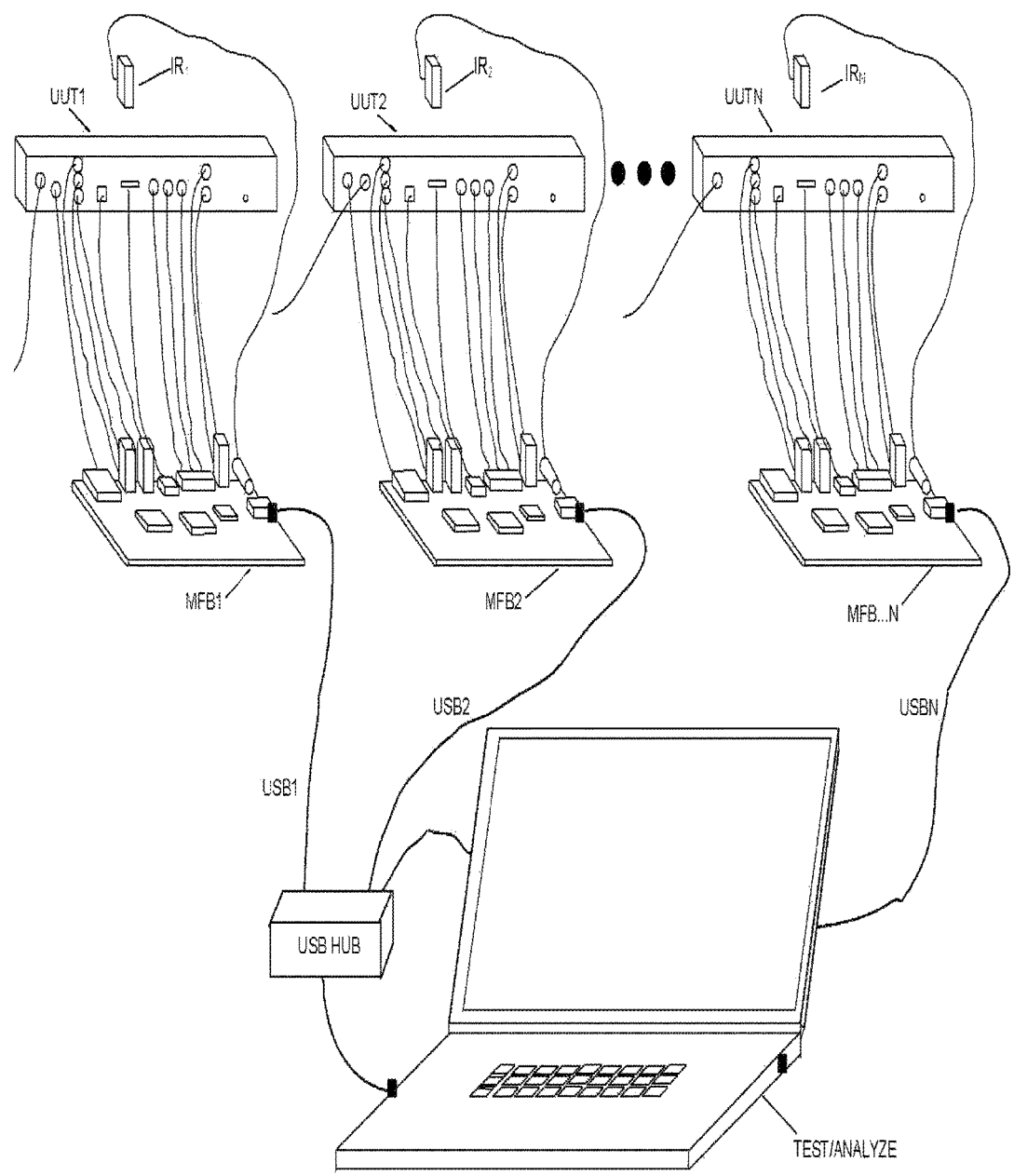
FIG. 1 illustrates a prior-art test system for end-user devices such as set top boxes and game consoles.

FIG. 1 illustrates a test system for user devices such as set top boxes and game consoles. Multiple units under test (UUT1, UUT2, . . . UUTN) are coupled to multiple multi-media-format boards: MFB1, MFB2, . . . MFBN. The multi-media-format boards may each offer a set of media format conversion functionality. The connectivity employed between a particular UUT and its associated MFB may vary according to the make and model of the UUT and or MFB. Some UUTs may receive signals which are not directed from or through the MFB with which they are associated, for example signals from a service provider headend, The inputs to a MFB, UUT, and the connections between an MFB and UUT, may vary according to the make and model of UUT, complicating the testing process.

Polling, control, initialization, and configuration signals provided by the service provider (e.g., a cable television network operator, an Internet Service Provider, etc.) to the UUT are supplied via a direct connection between the UUT and the service provider network.

In order to swap a UUT with another for testing purposes, it may be necessary to manually reconfigure the connections between the UUT and the MFB, and the UUT and the service provider.

Each MFB may be coupled to test logic (e.g. a laptop computer), for example via a Universal Serial Bus (USB). Each MFB may drive an infrared (IR) signal source (IR1, IR2 . . . IRN) to control the UUT. A USB hub may be employed to expand the number of ports available on a laptop, personal computer, or other test device.

Figure 2:
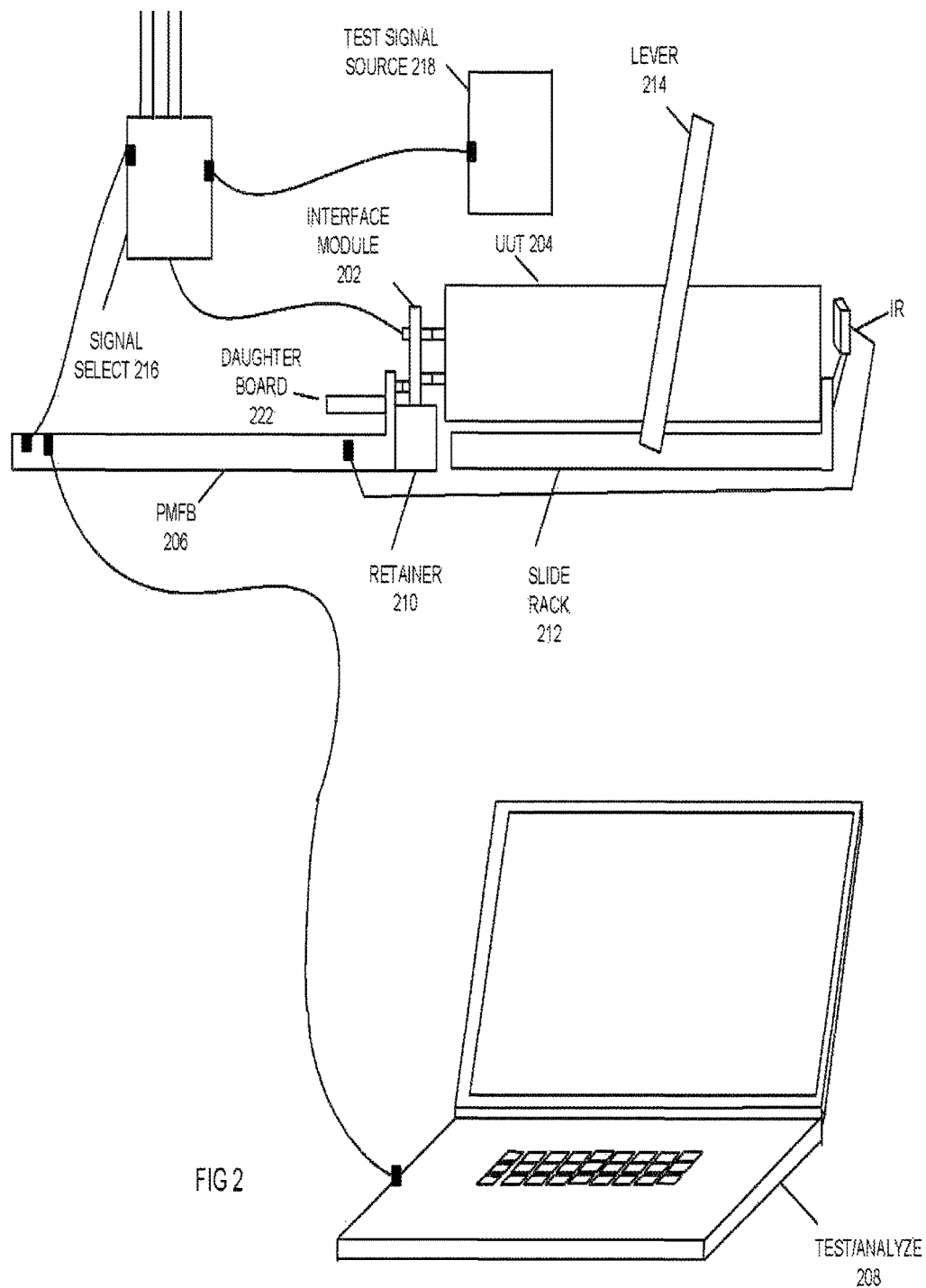
FIG. 2 illustrates an embodiment of a novel automated test system for end-user devices.

FIG. 2 illustrates an embodiment of a novel automated test system for end-user devices. Inputs to a unit under test (UUT) are received at a pluggable interface module 202, which adapts and positions the signals to be received by the UUT 204. The interface module 202 comprises inputs to and outputs from the UUT 204.

A multi-media format board 206 (MFB) may be configured with logic that is downloaded and installed on the board 206, making it a programmable multi-media format board (PMFB). This may enable use of a single PMFB with multiple makes and models of UUT. The PMFB 206 may be configured to provide all of the inputs that the UUT 204 receives, and to receive all outputs of interest for testing from the UUT 204. In this manner, it may be possible to simply disengage a particular UUT from the interface module 202, and plug in a new UUT, without manually removing or installing any cabling or connections to the UUT 204 or PMFB 206.

The interface module 202 may comprise an identification (e.g. an assembly part number) that corresponds to the supported model. This identification may be coded into a non-volatile memory of the interface module 202. The PMFB 206 may be adapted to automatically detect the make and model of a UUT 204 coupled thereto by interacting with the UUT 204 and/or with the interface module 202, and may download and/or activate appropriate logic (e.g. from the test/analysis logic 208) to interact with and facilitate the testing of the UUT 204. Upon detecting the make and model of a UUT 204, the PMFB 206 may inform the test/analysis logic 208 of this information, so that the test/analysis logic 208 may select appropriate test and analysis logic for the UUT 204. Logic of the test system may provide for parallel processing, such that each UUT 204 may be tested independently and concurrently. Multi-threading may be employed to accomplish this.

The PMFB 206 may convert outputs of the UUT 204 to a binary format suitable for processing and analysis by the test/analysis logic 208. Each PMFB 206 may have associated test logic, or multiple PMFBs may output data in parallel to shared test/analysis logic. Outputs of the PMFB 206 to test/analysis logic 208 may be provided in some embodiments via universal serial bus (USB). The pluggable interface module 202 may be adapted to fit, e.g. slot into, a retainer 210. The interface module 202 is interchangeable and may be specific to a make and model of UUT 204, whereas the retainer 210 may comprise a universal configuration (inputs and outputs) common among all makes and models of UUT 204. A slide rack 212 driven by a lever 214, crank, or other mechanism may be provided for loading the UUT 204 and for mechanically engaging it with the interface module 202 via operation of the lever 214 or other control The lever 214 or other control may likewise be employed to disengage the UUT 204 from the interface module 202, at which point the UUT 204 and/or the modular interface 202 may be removed and replaced with another UUT 204 and/or interface module 202.

The PMFB 206 may comprise logic for the decoding and reformatting of various media formats, such as Component, Composite, S-video, HDMI, and analog video. The format logic may also support S/PDIF and/or coaxial/optical audio formats, to name just some examples. Logic to decode different media formats may be downloaded by the PMFB 206 in some embodiments. Thus, a single PMFB 206 may be employed with various UUTs that operate upon or output various media formats.

Polling, control, initialization, and configuration signals provided by the service provider (e.g., a cable television network operator, an Internet Service Provider, etc.) to the UUT are provided via a source signal selector 216. The source signal selector 216 may choose from among multiple available service provider sources and direct signals from the chosen source to the interface module 202 (note that the signals from the chosen source may in some implementations be directed to the retainer 210, which may comprise inputs and outputs common to all makes and models of UUT 204. For example, the source signal selector 216 may choose signals from a particular headend of a cable television provider, depending upon the make/model of the UUT 204. The source signal selector 216 may choose signals from different service providers depending on the type of UUT (e.g. set top box, game console, etc.). The source signal selector 216 may comprise a configurable RF attenuation control to stress the RF input of the unit under test. This may be employed to detect anomalies on units failing when the RF level is below certain threshold levels.

A carousel server (OLL, e.g. a Motorola Offline Loader, not shown in drawings) may be employed to load code objects on various set-top boxes. Deploying an OLL may increase the throughput of loading desired code objects independent from a service provider source. The signal selector 216 may be used in conjunction with the OLL to help prepare the set-top boxes with specific code objects.

Either or both of the PMFB 206 or source signal selector 216 may determine the make and/or model of the UUT 204. If the PMFB 206 makes this determination, it may in some embodiments communicate the make/model information to the source signal selector 216 and/or direct the source signal selector 216 to select a particular source. If the source signal selector 216 makes this determination, it may, in some embodiments, communicate the information to the PMFB 206 and/or direct the PMFB 206 to select a particular source. Media signals may be provided via a tunable RF channel from a local source 218, instead of from the provider network. The local source need not be "local" to the test system, but may be any source other than the service provider network. The local media test signals may be substituted for signals from the provider network (e.g. the provider signals may be filtered out and replaced), or the local signals may supplement the polling, control, initialization, and configuration signals normally provided by the service provider.

The source 218 of the local media test signals may be a separate server for this purpose, and/or the test/analysis logic 208 or devices may provide the local media test signals. In some embodiments, the media test signals may be selected according to the make and/or model of the UUT 204. The system may include logic to apply the media test signals to the UUT via a same physical medium as service provider configuration signals are applied to the UUT. This logic may be comprised by the source signal selector 216, the pluggable interface module 202, the media format board 206, or some other device (e.g. an RF coupler in the signal path).

Control signals that drive features of the UUT 204 may be provided, for example by an IR port and/or USB from the PMFB 206. PCI or SPI control and data exchange may also be employed to interact with the UUT 204. The PMFB 206 may operate as a frame grabber which captures one or more frames output by the UUT 204, buffers the captured frame(s), converts them to a data stream, and transfers them to the test/analysis logic 208, for example via a USB interface.

Logic to capture and process new/updated or different media formats, or to interact with new/different makes and models UUT 204, may be dynamically loaded to the PMFB 206 by the test/analysis logic 208 or another device. Dynamic loading of logic to the PMFB 206 may be based upon a determination of the make and/or model number of the UUT 204.

A test platform employing features of the described test system embodiment(s) may be arranged in horizontal, vertical, and/or grid configurations, with one, two, four, eight, or up to 24 UUT test stations, to name some of the possibilities.

Figure 3:
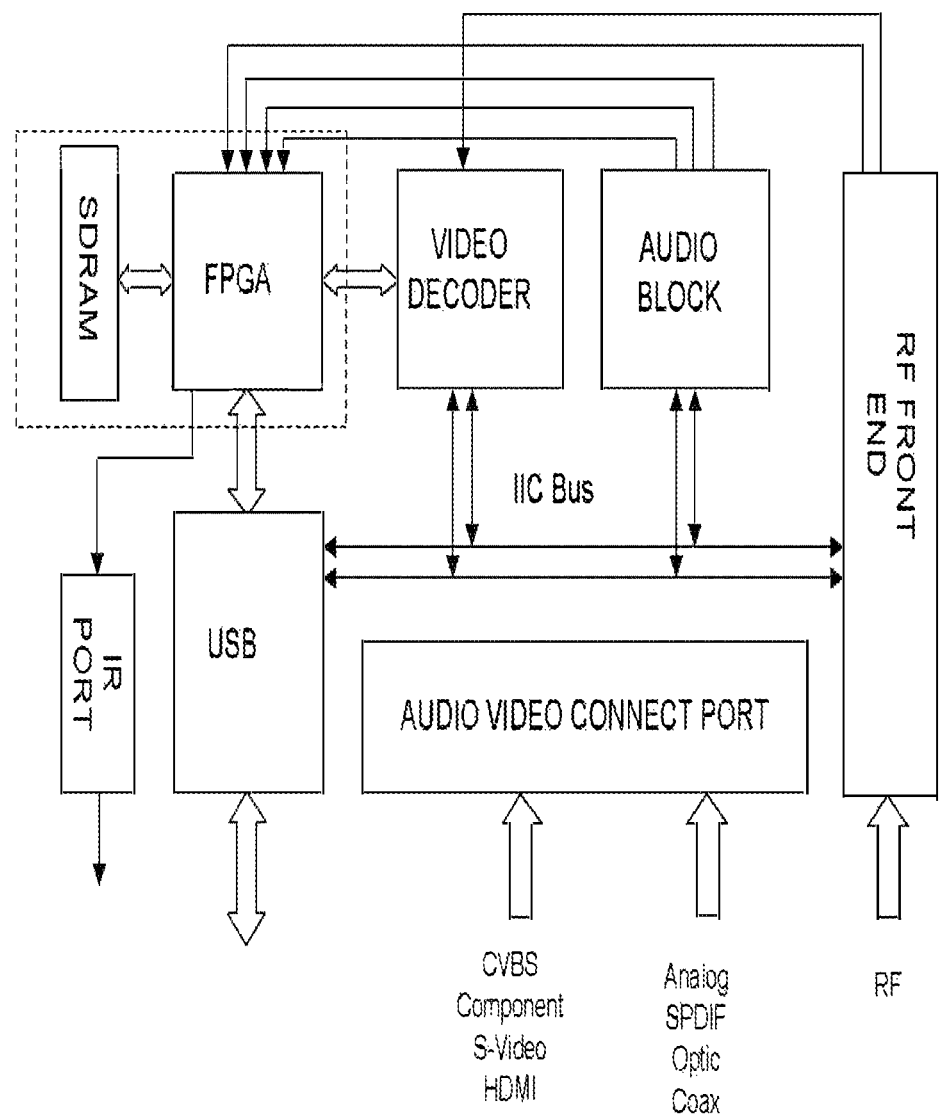
FIG. 3 illustrates an embodiment of a novel programmable multiformat board.

FIG. 3 illustrates an embodiment of a novel programmable multi-media format board. Various components readily apparent to those skilled in the art are omitted from the illustration for purposes of keeping the description concise. The board may be programmed with new/changed media processing logic via parallel port, USB, or other digital interfaces, which may communicate and store upgrades to SDRAM, FLASH memory (not shown), or other volatile or nonvolatile program memory (e.g. memory of audio and video decoder blocks). Various board functions are coordinated using logic comprised by an FPGA, EPROM, EEPROM, ASIC, or other program memory storage. An IR port is available for communicating commands wirelessly to a UUT.

The board has a capability to receive and decode various media formats, such as CVBS, Component. S-Video, HDMI (high definition multimedia interface), S/PDIF, Digital audio, PCM, Dolby, and DTS. A secure daughter board 222 may be used to decode and test HDMI signals, with the decoded result then passed to the MFB. The HDMI daughter board tests the signal to comply with HDCP (high bandwidth digital content protection), because the decoded HDMI signal cannot be passed to a PC, laptop, or other unsecure digital platform without violation of the HDCP specification. The board may also have a capability to receive and decode analog, SPDIF, optical signals, as well as RF signals (e.g. via coaxial cable).

The board may comprise logic (e.g. in FPGA) to determine the make and model of a coupled UUT, and to adapt the applied media decoding logic accordingly, and to communicate the make and model information to a signal source for the UUT (or cause the signal source to select a signal suitable to the make and/or model of the UUT). This make and model information may be obtained from the UUT, or from the pluggable interface module, or from another source, depending on the implementation.

The board may comprise logic (e.g. in FPGA) to adapt the applied media decoding logic based upon instructions from a signal source or other external device.

"Logic" refers to signals and/or information embodied in circuits (e.g. memory circuits) that may be applied to influence the operation of a device. Software, hardware, and firmware are examples of logic. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A test system, comprising:
   a first programmable multimedia test module configured to send and receive signals to and from a unit under test via signal cables;
   a retainer comprising a first signal interface and a second signal interface, the first signal interface configured to interface with the signal cables and the second signal interface configured to interface with the unit under test;
   a plurality of interface modules, each configured to swappably interface to the retainer and to the unit under test, each interface module of the plurality of interface modules configured to align signal terminals of the second signal interface with signal terminals of an I/O signal interface of a particular type of unit under test without the use of cables, wherein each I/O signal interface corresponds to the particular type of unit under test and comprises a different alignment of signal terminals; and the each interface module of the plurality of interface modules comprising a memory-encoded identification of the particular type of unit under test with which it is adapted to interface.

2. The test system of claim 1, further comprising:

a slide rack configured to engage the unit under test with one of the plurality of interface modules that is pluggably interfaced to the retainer.

3. The test system of claim 1, further comprising:

an analysis module coupled to the first programmable multimedia test module and to a second programmable multimedia test module; and each of the first programmable multimedia test module and the second programmable multimedia test module configured to read from a corresponding retainer a memory encoded identification of the particular type of unit under test, and to communicate with the analysis module to download decode logic from the analysis module to decode media formats specific to the particular type of unit under test.

4. The test system of claim 3, further comprising:

the analysis module configured to receive the memory encoded identification of the particular type of unit under test from each of the first programmable multimedia test module and the second programmable multimedia test module; and the analysis module configured to select test and analysis logic specific to the particular type of unit under test, and to associate each of the test and analysis logic specific to the particular type of unit under test with signals received from a programmable interface module corresponding to the particular type of unit under test.

5. The test system of claim 3, further comprising:

each of the first programmable multimedia test module and the second programmable multimedia test module configured to convert the media formats specific to the particular type of unit under test into binary signals communicated to a first analyzer of the analysis module and a second analyzer of analysis module, respectively.

6. The test system of claim 1, further comprising:

the each interface module of the plurality of interface modules comprising an interface to a source signal selector that provides a plurality of audio/video source signals from a network video service provider.

7. The test system of claim 6, further comprising:

the each interface module of the plurality of interface modules configured to make a memory encoded identification of the particular type of unit under test readable from the retainer.

8. The test system of claim 6, further comprising:

the each interface module of the plurality of interface modules configured to communicate a memory encoded identification of the particular type of unit under test to the source signal selector.

9. The test system of claim 1, further comprising:

the retainer comprising a third signal interface to a source signal selector that provides a plurality of audio/video source signals from a network video service provider.

10. A method, comprising the steps of:

choosing a selected interface module from a plurality of interface modules, each of the plurality of interface modules comprising a memory-encoded identification unique to a type of unit that may be tested;

coupling a retainer to a programmable multimedia test module at a first signal interface of the retainer;

coupling the retainer, at a second signal interface of the retainer, to a unit under test without using cables;

operably connecting the selected interface module to the retainer, the retainer configured to connect to any of the plurality of interface modules;

communicating the memory-encoded identification from the selected interface module to an analysis module coupled to the programmable multimedia test module;

selecting, by the analysis module, test and analysis logic specific to the type of unit under test;

receiving, at the programmable multimedia test module, signals from a signal source; and associating, by the analysis module, selected test and analysis logic with the signals received by the programmable multimedia test module.

11. The method of claim 10, wherein the unit under test includes an input-output (I/O) signal interface, and wherein the step of coupling the retainer, at a second signal interface of the retainer, to a unit under test without using cables comprises:

aligning signal terminals of the I/O signal interface with the second signal interface of the retainer, an alignment of the I/O signal interface differing for each type of unit under test.

12. The method of claim 10, further comprising downloading, at the programmable multimedia test module, the selected test and analysis logic from the analysis module.

13. The method of claim 12, further comprising decoding, at the programmable multimedia test module, media formats specific to the type of unit under test.

14. The method of claim 10, wherein the programmable multimedia test module is a first programmable multimedia test module, the retainer is a first retainer, and the unit under test is a first unit under test, and further comprising the steps of:

coupling both the first programmable multimedia test module and a second programmable multimedia test module to the analysis module;

coupling the second programmable multimedia test module to a second retainer, the second retainer operably connected, without cables, to a second unit under test; and reading, at the first programmable multimedia test module and at the second programmable multimedia test module, a memory encoded identification from each of the first retainer and second retainer.

15. The method of claim 14, further comprising the step of:

decoding, at the first programmable multimedia test module and at the second programmable multimedia test module, media formats specific to the first unit under test and to the second unit under test.

16. The method of claim 15, wherein the step of decoding, at the first programmable multimedia test module and at the second programmable multimedia test module, media formats specific to the first unit under test and to the second unit under test comprises converting the media formats into binary signals.

17. The method of claim 16, further comprising the steps of:

communicating the binary signals associated with the first unit under test to a first analyzer of the analysis module; and communicating the binary signals associated with the second unit under test to a second analyzer of the analysis module.

18. The method of claim 10, further comprising the step of:

providing, by a source signal selector coupled to the selected interface module, a plurality of source signals from a source.

19. The method of claim 18, further comprising the step of:

communicating, by the selected interface module, the memory-encoded identification to the source signal selector.

20. The method of claim 18 further comprising the step of:

determining a make and/or model of the unit under test by a component selected from the programmable multimedia test module and the source signal selector.

\* \* \* \* \*